(12) United States Patent
Huang et al.

(10) Patent No.: US 10,866,505 B2
(45) Date of Patent: Dec. 15, 2020

(54) MASK PROCESS CORRECTION

(71) Applicant: Taiwan Semiconductor Manufacturing Co., Ltd., Hsinchu (TW)

(72) Inventors: Hsu-Ting Huang, Hsinchu (TW); Ru-Gun Liu, Hsinchu County (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 0 days.

(21) Appl. No.: 16/554,318

(22) Filed: Aug. 28, 2019

(65) Prior Publication Data

US 2020/0096857 A1    Mar. 26, 2020

Related U.S. Application Data

(60) Provisional application No. 62/734,578, filed on Sep. 21, 2018.

(51) Int. Cl.
*G06F 30/398* (2020.01)
*G03F 1/36* (2012.01)
*G03F 1/70* (2012.01)
*G06F 30/20* (2020.01)

(52) U.S. Cl.
CPC .......... *G03F 1/36* (2013.01); *G03F 1/70* (2013.01); *G06F 30/20* (2020.01); *G06F 30/398* (2020.01)

(58) Field of Classification Search
CPC ... G03F 1/36; G03F 1/70; G06F 30/20; G06F 30/398
USPC .......................................... 716/53
See application file for complete search history.

(56) References Cited

U.S. PATENT DOCUMENTS

| | | |
|---|---|---|
| 8,796,666 B1 | 8/2014 | Huang et al. |
| 8,850,366 B2 | 9/2014 | Liu et al. |
| 8,906,595 B2 | 12/2014 | Liu et al. |
| 8,954,899 B2 | 2/2015 | Wu et al. |
| 9,093,530 B2 | 4/2015 | Huang et al. |
| 9,367,655 B2 | 6/2016 | Shih et al. |
| 9,390,217 B2 | 7/2016 | Wang et al. |
| 9,548,303 B2 | 1/2017 | Lee et al. |
| 9,863,761 B2 * | 1/2018 | Shi ........................ G01B 11/24 |
| 9,865,542 B2 | 1/2018 | Liaw et al. |
| 9,870,443 B2 | 1/2018 | Huang et al. |

(Continued)

FOREIGN PATENT DOCUMENTS

WO    WO 2012/068323 A2    5/2012

OTHER PUBLICATIONS

Hamouda Ayman and Abdelghany Hesham, "Combining mask and OPC process verfication for improved wafer patterning and yield", Proc. of Spie, vol. 9985, Photomask Technology, 2016, 99852A (Oct. 25, 2016): doi: 10.1117/12.2246563.

*Primary Examiner* — Suresh Memula
(74) *Attorney, Agent, or Firm* — Haynes and Boone, LLP

(57) ABSTRACT

Provided is a method for fabricating a semiconductor device including performing an OPC process to an IC layout pattern to generate a post-OPC layout pattern. In some embodiments, the method further includes applying an MPC model to the post-OPC layout pattern to generate a simulated mask pattern. By way of example, the simulated mask pattern is compared to a mask pattern calculated from a target wafer pattern. Thereafter, and based on the comparing, an outcome of an MPC process is determined.

20 Claims, 8 Drawing Sheets

(56) References Cited

U.S. PATENT DOCUMENTS

| | | | |
|---|---|---|---|
| 10,134,124 B2* | 11/2018 | Ma | G03F 7/00 |
| 2010/0280812 A1* | 11/2010 | Zhang | G03F 7/70625 |
| | | | 703/13 |
| 2011/0161893 A1* | 6/2011 | Lin | G03F 1/86 |
| | | | 716/52 |
| 2012/0128228 A1 | 5/2012 | Fujimura et al. | |
| 2012/0224156 A1* | 9/2012 | Lee | G03F 1/70 |
| | | | 355/52 |
| 2013/0073070 A1* | 3/2013 | Tsai | G01N 21/47 |
| | | | 700/103 |
| 2016/0283617 A1* | 9/2016 | Bailey | G03F 7/70625 |
| 2017/0004233 A1* | 1/2017 | Han | G06F 30/398 |
| 2017/0024510 A1* | 1/2017 | Shin | G06F 30/398 |
| 2017/0115556 A1 | 4/2017 | Shim et al. | |
| 2017/0309008 A1* | 10/2017 | Shi | G03F 7/705 |
| 2018/0082415 A1* | 3/2018 | Sezginer | G03F 7/705 |
| 2019/0018325 A1* | 1/2019 | Kim | G03F 1/84 |
| 2019/0187570 A1* | 6/2019 | Mack | G03F 7/70616 |

* cited by examiner

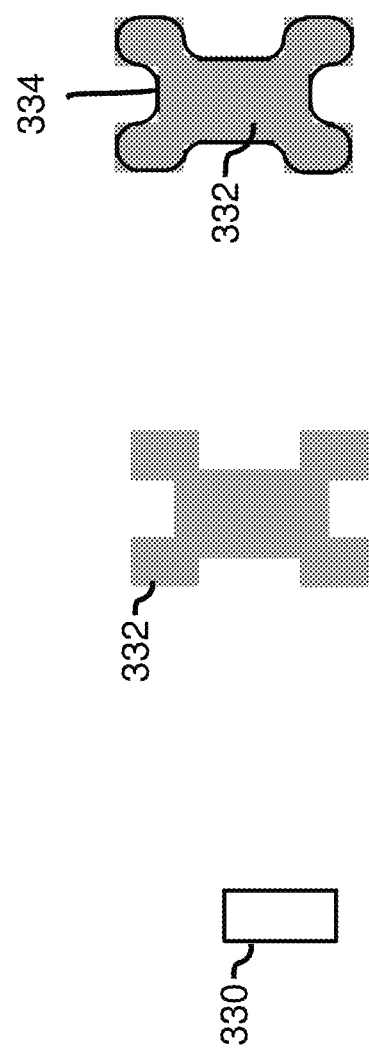

MASK PROCESS CORRECTION

CROSS-REFERENCE TO RELATED APPLICATION

This application claims the benefit of U.S. Provisional Application No. 62/734,578, filed Sep. 21, 2018, the entirety of which is incorporated by reference herein.

BACKGROUND

The electronics industry has experienced an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

As merely one example, scaling down of IC dimensions has been achieved by extending the usable resolution of a given lithography generation by the use of one or more resolution enhancement technologies (RETs), such as phase shift masks (PSMs), off-axis illumination (OAI), and optical proximity correction (OPC). However, because of various fabrication factors during the mask making process, a mask pattern formed on a photomask may be different from a desired mask layout. In order to compensate for defects introduced during the mask making process, mask process correction (MPC) may be applied after an OPC process. By using MPC, the written mask pattern should match the post-OPC mask layout. However, adoption of an MPC process may not necessarily help, for example, because the OPC model may have compensated for some of the mask proximity effects and because both OPC and MPC models themselves have errors. Thus, existing techniques have not proved entirely satisfactory in all respects.

BRIEF DESCRIPTION OF THE DRAWINGS

Aspects of the present disclosure are best understood from the following detailed description when they are read with the accompanying figures. It is noted that, in accordance with the standard practice in the industry, various features are not drawn to scale. In fact, the dimensions of the various features may be arbitrarily increased or reduced for clarity of discussion.

FIGS. 3A, 3B, and 3C illustrate exemplary layout patterns at various stages of the method of FIG. 3;

DETAILED DESCRIPTION

Figure 1:
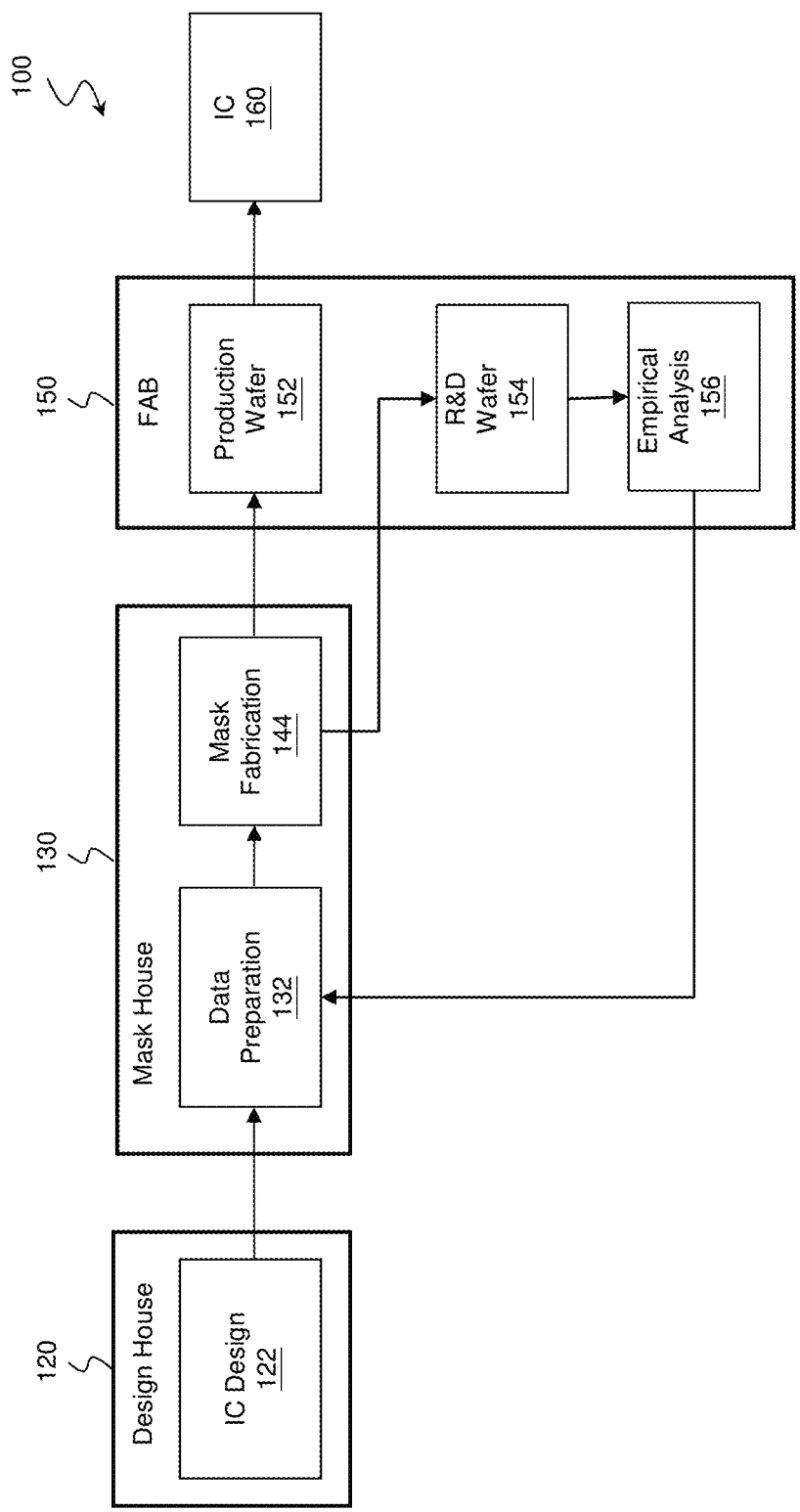
FIG. 1 is a simplified block diagram of an embodiment of an integrated circuit (IC) manufacturing system and an associated IC manufacturing flow.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to a mask process correction (MPC) process, and specifically, to providing an indication as to whether an MPC process will improve a final wafer printing of a particular pattern. Currently, because of various fabrication factors during the mask making process, a mask pattern formed on a photomask may be different from a desired mask layout. In order to compensate for defects introduced during the mask making process, an MPC process may be applied after an OPC process. Thus, in some examples, the MPC process may be equivalently referred to as a post-OPC correction process. By using MPC, the written mask pattern should match the post-OPC mask layout. However, adoption of an MPC process may not necessarily help (but it may not be known until after a wafer is patterned), for example, because the OPC model may have compensated for some of the mask proximity effects and because both OPC and MPC models themselves have errors. For example, as a result of the mask proximity effect, an OPC model may include mask corner rounding terms, where such mask corner rounding terms are more properly handled by an MPC process. By way of example, various shapes in a mask layout may not be transferred with perfect fidelity onto a mask (e.g., during mask fabrication). Specifically, sharp angles in a mask layout may become "rounded" during mask fabrication. This effect is known as "mask corner rounding." In addition, other OPC model terms may be adjusted to compensate for the mask making effects during OPC model calibration, where such terms are more properly handled by an MPC process. Moreover, existing techniques do not provide an indication as to whether an MPC process will improve final wafer printing.

Embodiments of the present disclosure offer advantages over existing art, though it is understood that other embodiments may offer different advantages, not all advantages are necessarily discussed herein, and that no particular advantage is required for all embodiments. By the disclosed methods, shortcomings of existing MPC processes are effectively overcome. For example, embodiments of the present disclosure provide for using an inverse method (e.g., such as inverse lithography technology, ILT) to reverse a wafer pattern into a mask pattern (e.g., creating an inverse mask pattern). For purposes of this discussion, an inverse mask pattern may include a mask pattern that is calculated from a given target aerial image or from a target pattern (e.g., such as a wafer pattern). In some embodiments, the inverse method used to reverse the wafer pattern into the mask pattern uses an OPC model without mask corner rounding terms. In some examples, by comparing the inverse mask pattern to a calculated/simulated mask pattern using an MPC model, it can be predetermined whether or not the MPC process would improve final wafer printing. By providing an early indication as to whether an MPC process, used after an OPC process, will actually improve wafer printing, time and cost of additional mask making and wafer printing can be avoided. Those of skill in the art will readily appreciate that the methods described herein may be applied to a variety of semiconductor layouts, semiconductor devices, and semiconductor processes to advantageously achieve similar benefits to those described herein without departing from the scope of the present disclosure.

FIG. 1 is a simplified block diagram of an embodiment of an integrated circuit (IC) manufacturing system 100 and an IC manufacturing flow associated therewith, which may benefit from various aspects of the present disclosure. The IC manufacturing system 100 includes a plurality of entities, such as a design house 120, a mask house 130, and an IC manufacturer 150 (i.e., a fab), that interact with one another in the design, development, and manufacturing cycles and/or services related to manufacturing an integrated circuit (IC) device 160. The plurality of entities are connected by a communications network, which may be a single network or a variety of different networks, such as an intranet and the Internet, and may include wired and/or wireless communication channels. Each entity may interact with other entities and may provide services to and/or receive services from the other entities. One or more of the design house 120, mask house 130, and IC manufacturer 150 may have a common owner, and may even coexist in a common facility and use common resources.

In various embodiments, the design house 120, which may include one or more design teams, generates an IC design layout 122. The IC design layout 122 may include various geometrical patterns designed for the fabrication of the IC device 160. By way of example, the geometrical patterns may correspond to patterns of metal, oxide, or semiconductor layers that make up the various components of the IC device 160 to be fabricated. The various layers combine to form various features of the IC device 160. For example, various portions of the IC design layout 122 may include features such as an active region, a gate electrode, source and drain regions, metal lines or vias of a metal interconnect, openings for bond pads, as well as other features known in the art which are to be formed within a semiconductor substrate (e.g., such as a silicon wafer) and various material layers disposed on the semiconductor substrate. In various examples, the design house 120 implements a design procedure to form the IC design layout 122. The design procedure may include logic design, physical design, and/or place and route. The IC design layout 122 may be presented in one or more data files having information related to the geometrical patterns which are to be used for fabrication of the IC device 160. In some examples, the IC design layout 122 may be expressed in an Open Artwork System Interchange Standard (OASIS) file format, a GDSII file format, or DFII file format.

In some embodiments, the design house 120 may transmit the IC design layout 122 to the mask house 130, for example, via the network connection described above. The mask house 130 may then use the IC design layout 122 to manufacture one or more masks to be used for fabrication of the various layers of the IC device 160 according to the IC design layout 122. In various examples, the mask house 130 performs mask data preparation 132, where the IC design layout 122 is translated into a form that can be physically written by a mask writer, and mask fabrication 144, where the design layout prepared by the mask data preparation 132 is modified to comply with a particular mask writer and/or mask manufacturer and is then fabricated. In the example of FIG. 1, the mask data preparation 132 and mask fabrication 144 are illustrated as separate elements; however, in some embodiments, the mask data preparation 132 and mask fabrication 144 may be collectively referred to as mask data preparation.

In some examples, the mask data preparation 132 includes application of one or more resolution enhancement technologies (RETs) to compensate for potential lithography errors, such as those that can arise from diffraction, interference, or other process effects. In some examples, optical proximity correction (OPC) may be used to adjust line widths depending on the density of surrounding geometries, add "dog-bone" end-caps to the end of lines to prevent line end shortening, correct for electron beam (e-beam) proximity effects, or for other purposes. For example, OPC techniques may add sub-resolution assist features (SRAFs), which for example may include adding scattering bars, serifs, and/or hammerheads to the IC design layout 122 according to optical models or rules such that, after a lithography process, a final pattern on a wafer is improved with enhanced resolution and precision. The mask data preparation 132 may also include further RETs, such as off-axis illumination (OAI), phase-shifting masks (PSM), other suitable techniques, or combinations thereof.

The mask data preparation 132 may further include a mask process correction (MPC) that is used to correct errors introduced during the mask making process. For example, the MPC may be used to correct mask making process effects such as fogging, development and etch loading and e-beam proximity effects. In some examples, the MPC process modifies a post-OPC design layout to compensate for limitations which may be encountered during mask fabrication 144.

In some embodiments, the mask data preparation 132 may further include lithography process checking (LPC) that simulates processing that will be implemented by the IC manufacturer 150 to fabricate the IC device 160. The LPC may simulate this processing based on the IC design layout 122 to create a simulated manufactured device, such as the IC device 160. The processing parameters in LPC simulation may include parameters associated with various processes of the IC manufacturing cycle, parameters associated with tools used for manufacturing the IC, and/or other aspects of the manufacturing process. By way of example, LPC may take into account various factors, such as aerial image contrast, depth of focus ("DOF"), mask error enhancement factor ("MEEF"), other suitable factors, or combinations thereof.

In some embodiments, after a simulated manufactured device has been created by LPC, if the simulated device layout is not close enough in shape to satisfy design rules, certain steps in the mask data preparation 132, such as OPC and MPC, may be repeated to refine the IC design layout 122 further.

It should be understood that the above description of the mask data preparation 132 has been simplified for the purposes of clarity, and data preparation may include additional features such as a logic operation (LOP) to modify the IC design layout according to manufacturing rules. Additionally, the processes applied to the IC design layout 122 during data preparation 132 may be executed in a variety of different orders.

After mask data preparation 132 and during mask fabrication 144, a mask or a group of masks may be fabricated based on the modified IC design layout. For example, an electron-beam (e-beam) or a mechanism of multiple e-beams is used to form a pattern on a mask (photomask or reticle) based on the modified IC design layout. The mask can be formed in various technologies. In an embodiment, the mask is formed using binary technology. In some embodiments, a mask pattern includes opaque regions and transparent regions. A radiation beam, such as an ultraviolet (UV) beam, used to expose a radiation-sensitive material layer (e.g., photoresist) coated on a wafer, is blocked by the opaque region and transmitted through the transparent regions. In one example, a binary mask includes a transparent substrate (e.g., fused quartz) and an opaque material (e.g., chromium) coated in the opaque regions of the mask. In some examples, the mask is formed using a phase shift technology. In a phase shift mask (PSM), various features in the pattern formed on the mask are configured to have a pre-configured phase difference to enhance image resolution and imaging quality. In various examples, the phase shift mask can be an attenuated PSM or alternating PSM.

In some embodiments, the IC manufacturer 150, such as a semiconductor foundry, uses the mask (or masks) fabricated by the mask house 130 to transfer one or more mask patterns onto a production wafer 152 and thus fabricate the IC device 160 on the production wafer 152. The IC manufacturer 150 may include an IC fabrication facility that may include a myriad of manufacturing facilities for the fabrication of a variety of different IC products. For example, the IC manufacturer 150 may include a first manufacturing facility for front end fabrication of a plurality of IC products (i.e., front-end-of-line (FEOL) fabrication), while a second manufacturing facility may provide back end fabrication for the interconnection and packaging of the IC products (i.e., back-end-of-line (BEOL) fabrication), and a third manufacturing facility may provide other services for the foundry business. In various embodiments, the semiconductor wafer (i.e., the production wafer 152) within and/or upon which the IC device 160 is fabricated may include a silicon substrate or other substrate having material layers formed thereon. Other substrate materials may include another suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. In some embodiments, the semiconductor wafer may further include various doped regions, dielectric features, and multilevel interconnects (formed at subsequent manufacturing steps). Moreover, the mask (or masks) may be used in a variety of processes. For example, the mask (or masks) may be used in an ion implantation process to form various doped regions in the semiconductor wafer, in an etching process to form various etching regions in the semiconductor wafer, and/or in other suitable processes.

In contrast to the embodiments disclosed herein, some other techniques may include the IC manufacturer 150 using the mask (or masks) fabricated by the mask house 130 to transfer one or more mask patterns onto an R&D wafer 154. After photolithography processing of the R&D wafer 154, the R&D wafer 154 may then be transferred to a test lab (e.g., metrology lab or parametric test lab) for empirical analysis 156. Thus, empirical data from the R&D wafer 154 may be collected, including evaluation of the experimental mask patterns. In various examples, the empirical mask pattern data may then be transferred to the mask house 130, where the IC design layout 122 may be further modified based on the empirical data. In various cases, the pattern design, processing, and empirical data collection is a labor-intensive and time-consuming process which adds undesirable delays to a technology development cycle, and it is not a process that can be repeated every time a new layout design and/or new single layout feature is encountered. Alternatively, as described in more detail below, embodiments of the present disclosure provide for a mask process correction (MPC) process, and specifically, provide an indication as to whether an MPC process will improve a final wafer printing of a particular pattern without having to process R&D wafers and collect empirical data, which is costly and results in technology development cycle delays.

Figure 2:
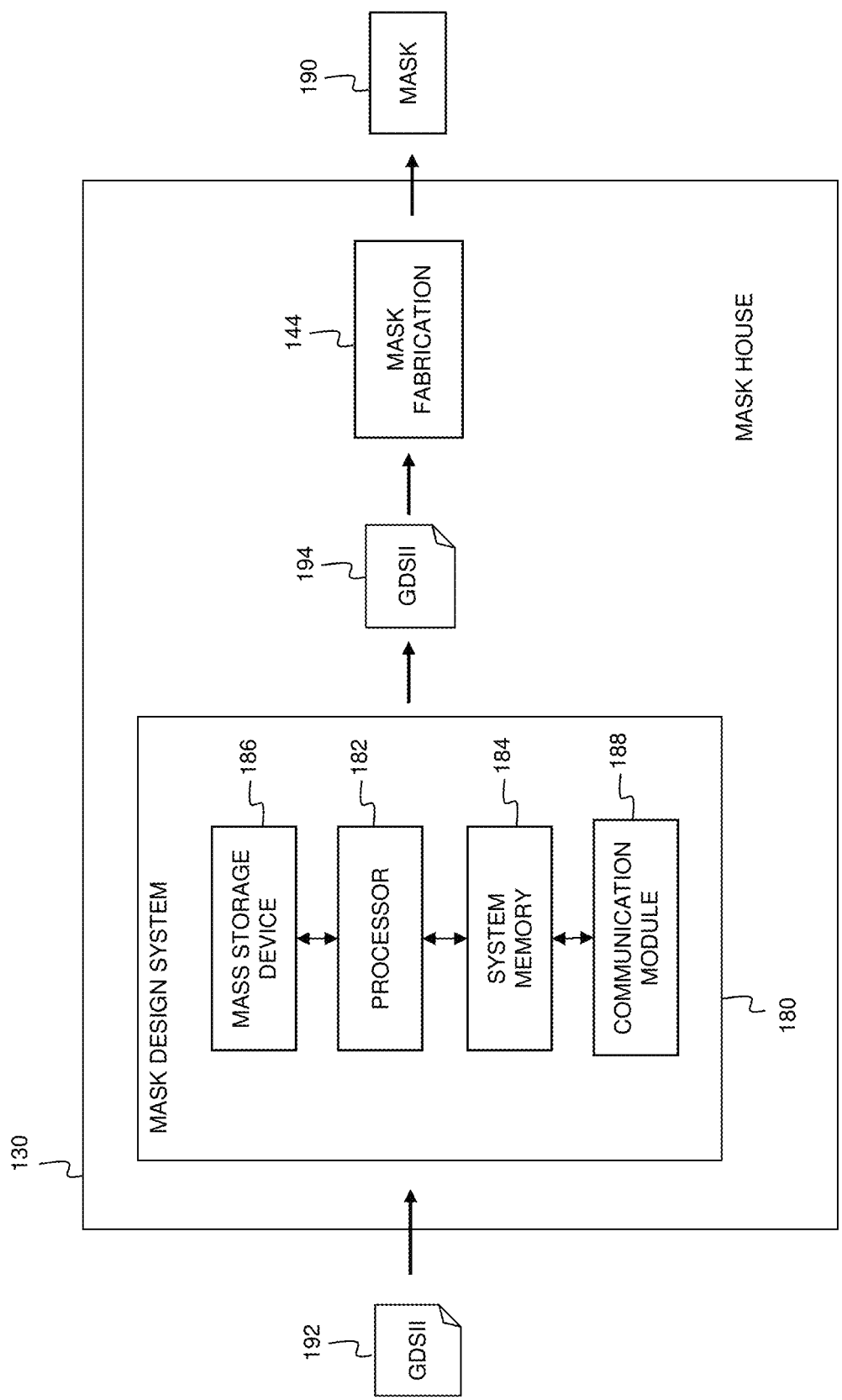
FIG. 2 is a more detailed block diagram of the mask house shown in FIG. 1 according to various aspects of the present disclosure.

Referring now to FIG. 2, provided therein is a more detailed block diagram of the mask house 130 shown in FIG. 1 according to various aspects of the present disclosure. In the example of FIG. 2, the mask house 130 includes a mask design system 180 that is operable to perform the functionality described in association with mask data preparation 132 of FIG. 1 and in association with methods 500 and 600 of FIGS. 5 and 6, discussed below. The mask design system 180 is an information handling system such as a computer, server, workstation, or other suitable device. The system 180 includes a processor 182 that is communicatively coupled to a system memory 184, a mass storage device 186, and a communication module 188. The system memory 184 provides the processor 182 with non-transitory, computer-readable storage to facilitate execution of computer instructions by the processor. Examples of system memory 184 may include random access memory (RAM) devices such as dynamic RAM (DRAM), synchronous DRAM (SDRAM), solid state memory devices, and/or a variety of other memory devices known in the art. Computer programs, instructions, and data are stored within the mass storage device 186. Examples of mass storage devices 186 may include hard discs, optical disks, magneto-optical discs, solid-state storage devices, and/or a variety of other mass storage devices. The communication module 188 is operable to communicate information such as IC design layout files with the other components in the IC manufacturing system 100, such as design house 120. Examples of communication modules 188 may include Ethernet cards, 802.11 WiFi devices, cellular data radios, and/or other suitable devices known in the art.

In operation, the mask design system 180 is configured to manipulate the IC design layout 122 according to a variety of design rules and limitations before it is transferred to a mask 190 by mask fabrication 144. For example, in an embodiment, mask data preparation 132, including ILT, OPC, MPC, and LPC, may be implemented as software instructions executing on the mask design system 180. In such an embodiment, the mask design system 180 receives a first GDSII file 192 containing the IC design layout 122 from the design house 120. After the mask data preparation 132 is complete, which in some embodiments may be after completion of the methods 500 and/or 600 of FIGS. 5 and 6, the mask design system 180 transmits a second GDSII file 194 containing a modified IC design layout to mask fabrication 144 (i.e., to a mask fabricator). In alternative embodiments, the IC design layout may be transmitted between the components in IC manufacturing system 100 in alternate file formats such as DFII, CIF, OASIS, or any other suitable file type. Further, the mask design system 180 and the mask house 130 may include additional and/or different components in alternative embodiments.

Figure 3:
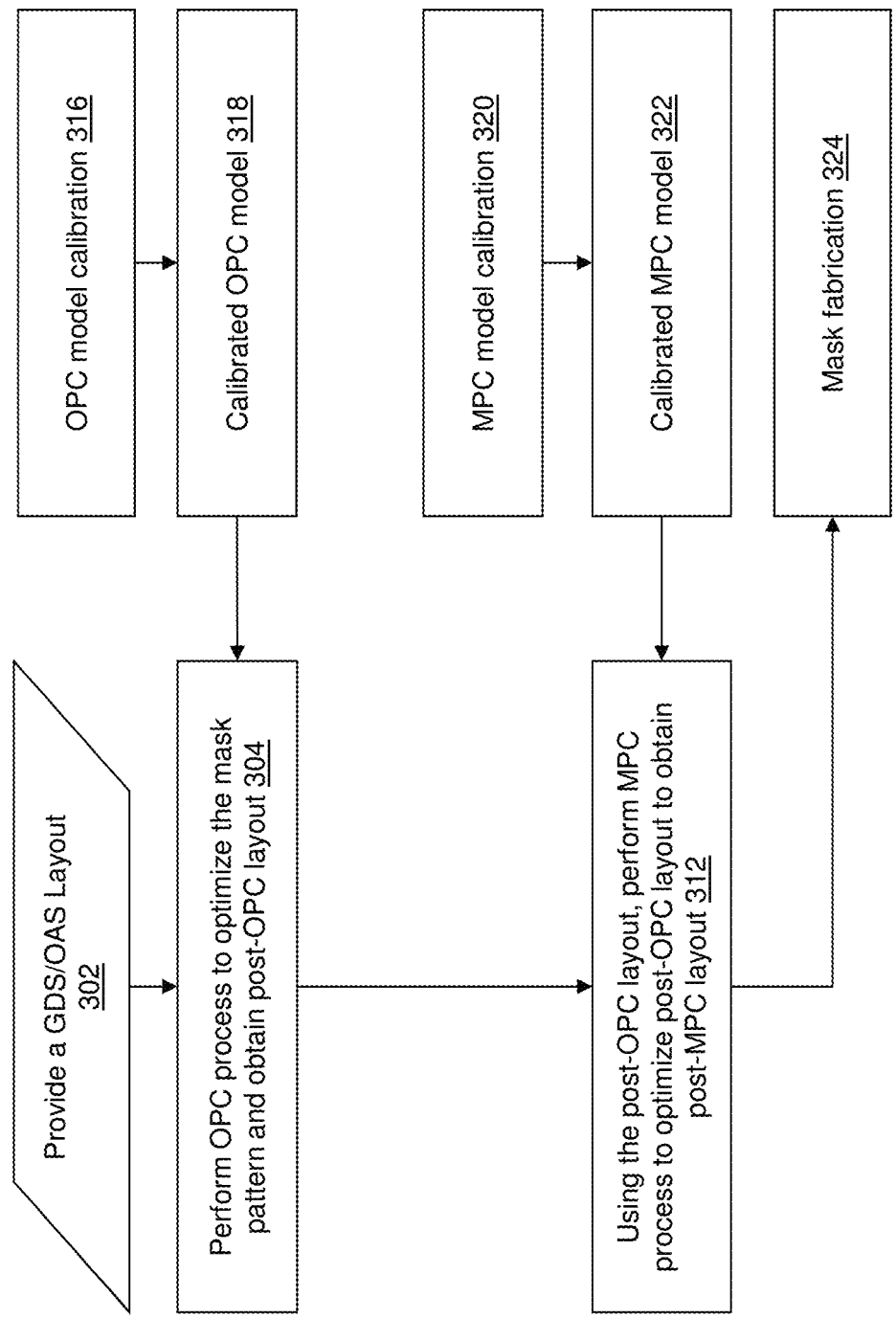
FIG. 3 illustrates a flow diagram for a method of modifying an IC design layout using OPC/MPC processes prior to mask fabrication.
Figure 4:
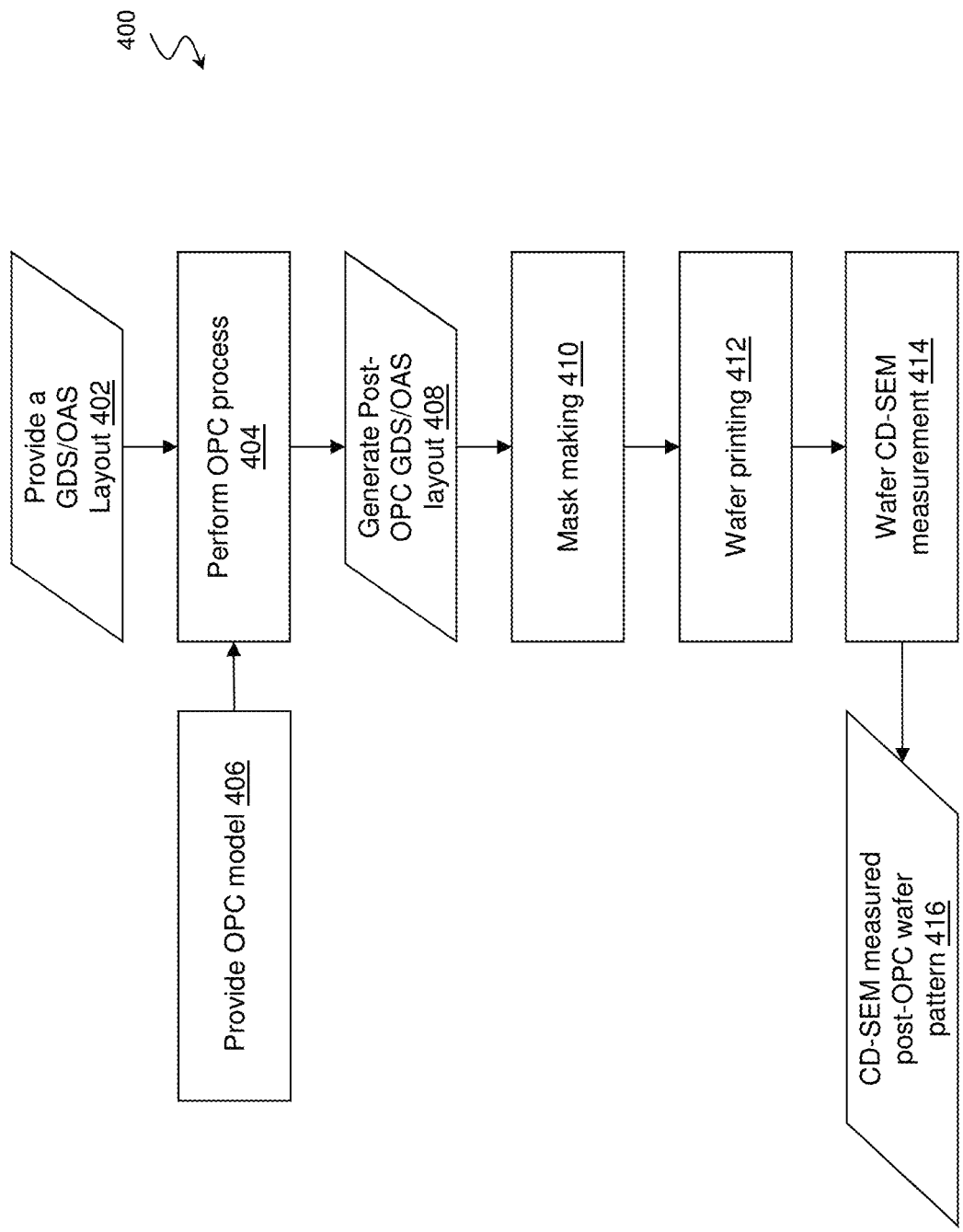
FIG. 4 illustrates a flow diagram for another method of modifying an IC design layout using OPC/MPC processes prior to mask fabrication.

To provide additional context to the discussion that follows, FIG. 3 and FIG. 4 provide some process flows that utilize OPC and/or MPC processes. For example, FIG. 3 shows a flow chart of a method 300 that illustrates a simplified method for modifying an IC design layout using OPC/MPC processes prior to mask fabrication. In some examples, the method 300 may be implemented in the mask data preparation 132 of mask house 130 shown in FIG. 1. The method 300 begins at block 302 where a layout design is provided. For purposes of discussion, the layout design provided at block 302 may include a pattern 330, as shown in FIG. 3A. The method then proceeds to block 304 where an OPC process is performed. In some examples, prior to performing the OPC process (block 304), an OPC model is provided and calibrated (blocks 316, 318). In various examples, the OPC process is used to optimize the provided layout design (e.g., such as the pattern 330) such that the mask fabrication 144 can provide a desired wafer target design. By way of example, a post-OPC layout design may include a pattern 332, as shown in FIG. 3B. In some cases, the OPC process utilizes an OPC model that includes mask corner rounding terms. In various embodiments, and regardless of whether the OPC model includes mask corner rounding terms, the OPC model may include other terms such as optical system terms (e.g., illumination terms and projection terms), lithography process terms (e.g., resist spin-on terms and exposure terms), resist model terms, as well as other terms. More specifically, the other terms included in the OPC model may include a numerical aperture (NA), a sigma value, an illuminator shape, film stack properties, a pattern density, or an aerial image slope, among others. The method then proceeds to block 312, where an MPC process is performed on the post-OPC layout (e.g., such as the pattern 332) to obtain a post-MPC layout. In the present example, the post-MPC layout design may include a pattern 334, as shown in FIG. 3C. In this example, the post-OPC layout design (the pattern 332) and the post-MPC layout design (the pattern 334) are slightly different. However, in some cases, the post-MPC layout design (the pattern 334) may be substantially the same as the post-OPC layout design (the pattern 332). In some examples, prior to performing the MPC process (block 312), an MPC model is provided and calibrated (blocks 320, 322). In some embodiments, the MPC process optimizes the mask layout such that the final mask pattern matches the mask target. In various examples, the post-MPC layout is then used for mask fabrication (block 324). Thereafter, in various examples, the fabricated mask may be used to pattern a wafer. However, if a patterned wafer that does not satisfy design requirements, aspects of the method 300 may have to be revised and repeated (e.g., OPC, MPC, mask fabrication).

FIG. 4 shows a flow chart of a method 400 that illustrates another simplified method for modifying an IC design layout using an OPC process prior to mask fabrication. In some examples, the method 400 may be implemented in the mask data preparation 132 of mask house 130 shown in FIG. 1. The method 400 begins at block 402 where a layout design is provided and proceeds to block 404 where an OPC process is performed. In some examples, prior to performing the OPC process (block 404), an OPC model is provided and calibrated (block 406). Performing the OPC process (block 404) generates a post-OPC layout (block 408). In some methods, the post-OPC layout is then used to fabricate a mask (block 410). After making the mask (block 410), the method 400 proceeds to block 412, where the mask is used (e.g., in a lithography process) to form a pattern on a wafer. Thereafter, at block 414, the patterned wafer is measured (e.g., by SEM) to provide CD-SEM measurement data for the post-OPC wafer pattern (block 416). In various cases, if the CD-SEM measurement data does not satisfy design requirements, aspects of the method 400 may have to be revised and repeated (e.g., OPC, mask fabrication, CD-SEM measurement).

Figure 5:
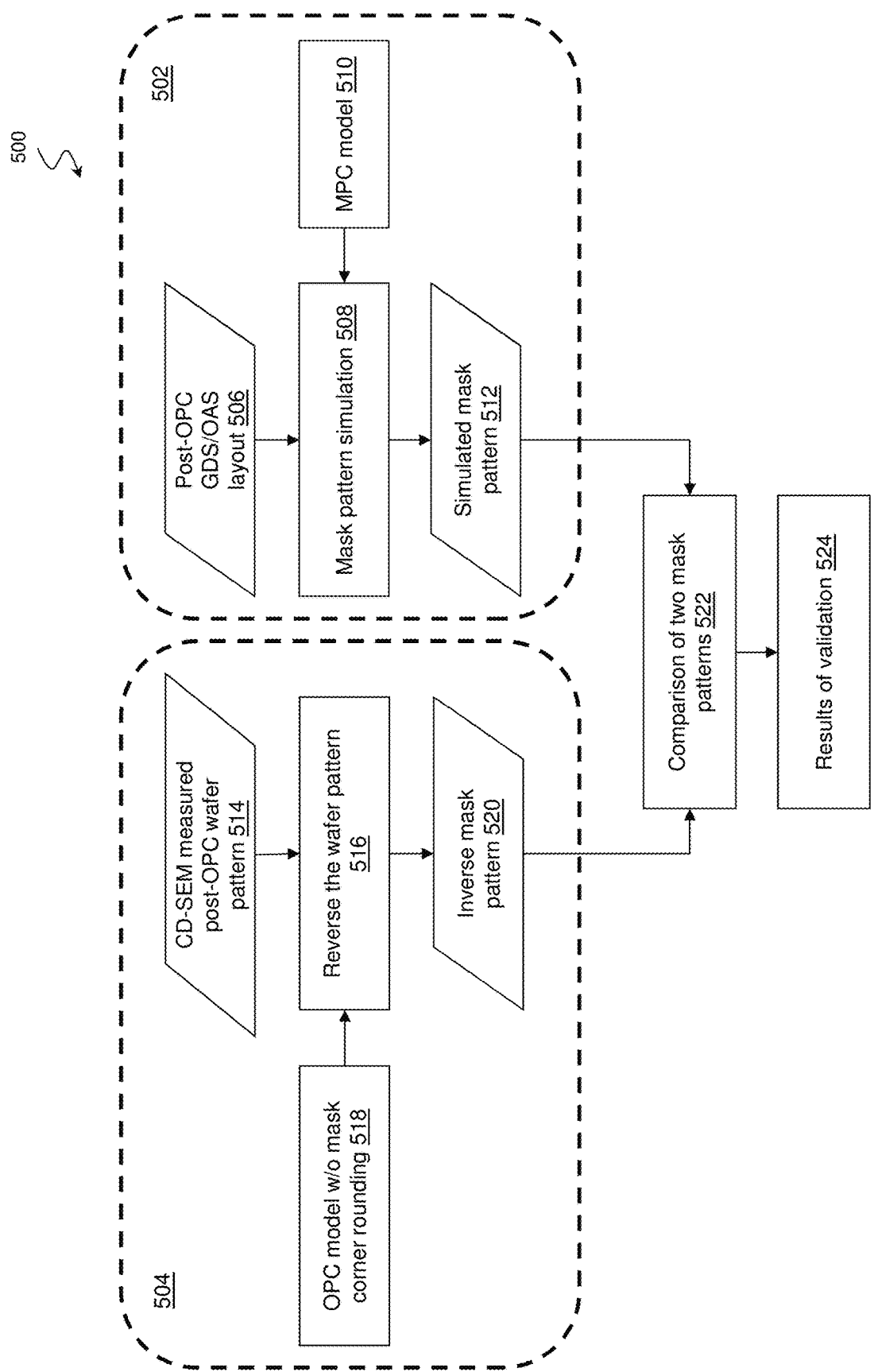
FIG. 5 illustrates a flow diagram for a method of pre-determining whether an MPC process will improve a final wafer pattern, in accordance with some embodiments.

In contrast to the aforementioned techniques, the following embodiments provide an early indication as to whether an MPC process, used after an OPC process, will actually improve wafer printing, thereby avoiding the time and cost of additional OPC/MPC processes, mask making, wafer printing, and pattern measurement. With reference now to FIG. 5, illustrated therein is a method 500 for pre-determining whether an MPC process will improve a final wafer pattern. In some embodiments, aspects of the method 500 may include modifying an IC design layout before mask fabrication. In some embodiments, the method 500 may be implemented in the mask data preparation 132 of mask house 130 shown in FIG. 1. Additional operations can be provided before, during, and after the method 500, and some operations described can be replaced, eliminated, or moved around for additional embodiments of the method. It is also noted that the method 500 is exemplary, and is not intended to limit the present disclosure beyond what is explicitly recited in the claims that follow.

Figure 5A:
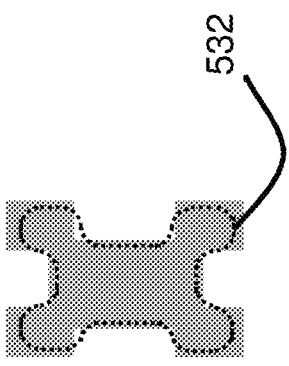
FIGS. 5A, 5B, 5C, and 5D illustrate exemplary layout patterns at various stages of the method of FIG. 5, in accordance with some embodiments.
Figure 5B:
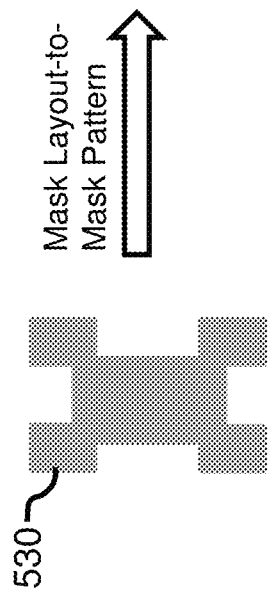

In some embodiments, the method 500 includes an MPC process group 502 and an OPC process group 504. In various examples, the MPC process group 502 and the OPC process group 504 may be performed in series or in parallel. Beginning with the MPC process group 502, at block 506, a post-OPC layout (e.g., a mask layout) is provided. By way of example, the post-OPC layout design may include a pattern 530, as shown in FIG. 5A. In some examples, the post-OPC layout of block 506 may be substantially similar to or the same as the post-OPC layout generated at block 408 of the method 400 or at block 304 of the method 300. In some embodiments, the method proceeds to block 508 where an MPC model (provided via block 510) is applied to the post-OPC layout (e.g., such as the pattern 530) to perform a mask pattern simulation. As a result of the mask pattern simulation of block 508, a simulated mask pattern is generated at block 512. In the present example, the simulated mask pattern may include a pattern 532, as shown in FIG. 5B.

Figure 5C:
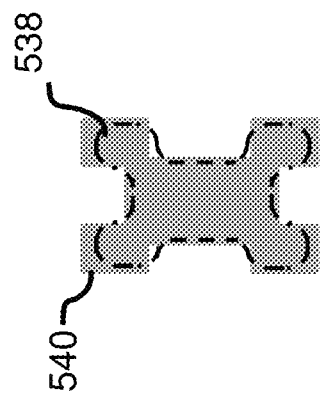
Figure 5D:
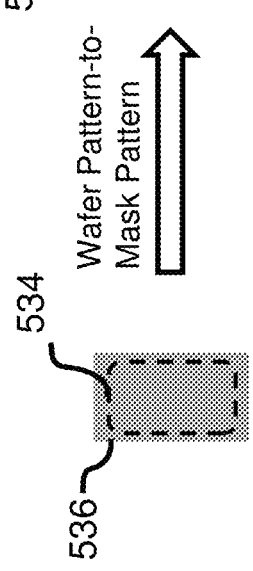

With reference to the OPC process group 504, at block 514, CD-SEM measurement data for the post-OPC wafer pattern is provided (e.g., this may also be referred to as a CD-SEM measured post-OPC wafer pattern). By way of example, FIG. 5C illustrates CD-SEM measurement data 534 for an exemplary post-OPC wafer pattern 536. In some cases, the post-OPC wafer pattern 536 may represent a simulated wafer pattern (e.g., that may be generated using the post-OPC layout, such as the pattern 530), while the CD-SEM measurement data 534 represents data for a physically measured patterned wafer. In some examples, the CD-SEM measurement data of block 514 may be similar to or the same as the CD-SEM measurement data of block 416 of the method 400. In some embodiments, the method 500 proceeds to block 516 where the CD-SEM measured post-OPC wafer pattern (e.g., the pattern 534) is reversed. In various cases, reversing the CD-SEM measured post-OPC wafer pattern includes performing an inverse process (e.g., such as an ILT process) using an OPC model without mask corner rounding terms (provided via block 518) to convert the CD-SEM measured post-OPC wafer pattern into a simulated mask pattern 538 (FIG. 5D). In some embodiments, another simulated mask pattern 540 may correspond to the simulated post-OPC wafer pattern 536. It is noted that while the OPC model without mask corner rounding terms is used to perform the inverse process, other OPC model terms may be used, as discussed above. For example, the OPC model may still include other terms such as optical system terms (e.g., illumination terms and projection terms), lithography process terms (e.g., resist spin-on terms and exposure terms), resist model terms, as well as other terms. By way of example, the inverse process may be performed using the OPC model without the mask corner rounding terms because it is desirable to obtain an actual pattern formed on a mask rather than a mask layout provided to a mask writer. In some embodiments, and as a result of reversing the CD-SEM measured post-OPC wafer pattern (block 516), an inverse mask pattern (the mask pattern 538) is provided at block 520. In some cases, for example when using an ILT process to perform the inverse process, a post-OPC layout, a simulated mask pattern, or an SEM measured mask pattern may be used to confine the ILT solution. Also, in some embodiments, the OPC model used for the inverse process may be similar to or the same as the calibrated OPC model (blocks 316, 318) of the method 300; however, for the inverse process of the method 500, the mask corner rounding terms are excluded.

Thus, after completion of the MPC process group 502 and the OPC process group 504, a simulated mask pattern (e.g., the pattern 532 of FIG. 5B) and a reversed mask pattern (e.g., the pattern 538 of FIG. 5D) are provided. The method 500 then proceeds to block 522 where the inverse mask pattern of block 520 (e.g., the pattern 538) is compared to the simulated mask pattern of block 512 (e.g., the pattern 532), and the results of the comparison are provided as validation results at block 524. In some embodiments, the comparison includes comparing mask contours or CDs obtained by each of the MPC process group 502 and the OPC process group 504. By way of example, and in some embodiments, if the inverse mask pattern matches (e.g., is substantially the same) the simulated mask pattern, then it is determined that an MPC process will in fact improve a final wafer pattern. As a result, the MPC process may be performed to the post-OPC layout pattern to generate a post-MPC layout pattern. Thereafter, a mask may be fabricated (e.g., by mask fabrication 144) based on the post-MPC layout pattern, and the fabricated mask may be used to pattern a wafer (e.g., by a lithography process). Alternatively, if the inverse mask pattern does not match the simulated mask pattern, then an MPC process may be skipped, thereby avoiding additional process time, cost, and complexity.

Figure 6:
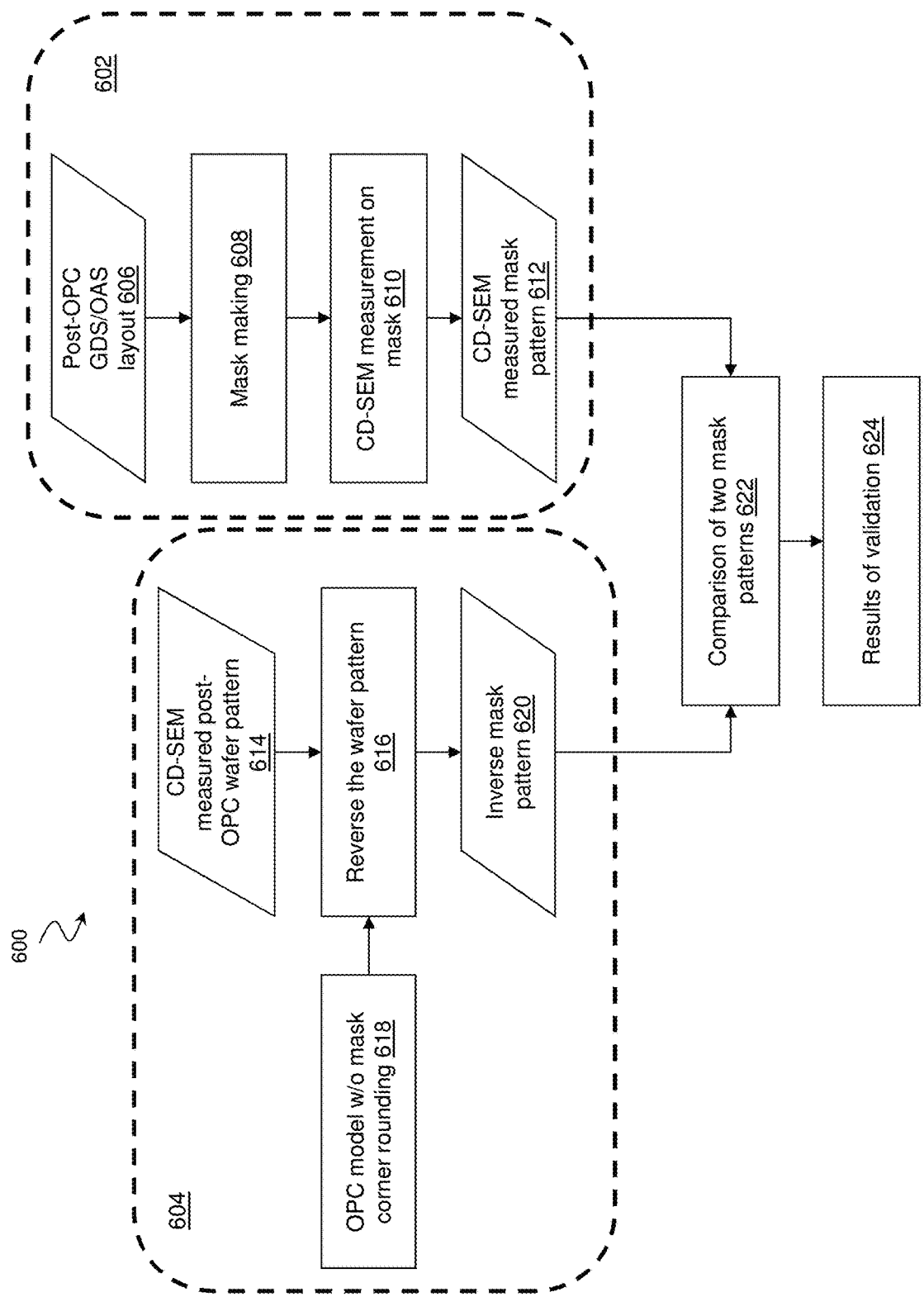
FIG. 6 illustrates a flow diagram for an alternative method of pre-determining whether an MPC process will improve a final wafer pattern, in accordance with some embodiments.

Referring to FIG. 6, illustrated therein is a method 600 that provides an alternative method for pre-determining whether an MPC process will improve a final wafer pattern. In some embodiments, aspects of the method 600 may include modifying an IC design layout before mask fabrication. In some embodiments, at least some aspect of the method 600 may be implemented in the mask data preparation 132 of mask house 130 shown in FIG. 1. Additional operations can be provided before, during, and after the method 600, and some operations described can be replaced, eliminated, or moved around for additional embodiments of the method. It is also noted that the method 600 is exemplary, and is not intended to limit the present disclosure beyond what is explicitly recited in the claims that follow.

In some embodiments, the method 600 includes a CD-SEM measurement process group 602 and an OPC process group 604. In various examples, the CD-SEM measurement process group 602 and the OPC process group 604 may be performed in series or in parallel. Beginning with the CD-SEM measurement process group 602, at block 606, a post-OPC layout is provided. In some examples, the post-OPC layout of block 606 may be substantially similar to or the same as the post-OPC layout generated at block 408 of the method 400. In some embodiments, the method proceeds to block 608 where the post-OPC layout (block 606) is used to fabricate a mask that includes various IC patterns, as described above. Thereafter, at block 610, the patterned mask is measured (e.g., by SEM) to provide CD-SEM measurement data for the mask pattern, which may also be referred to as a CD-SEM measured mask pattern (block 612).

In some embodiments, the OPC process group 604 is similar to the OPC process group 504 discussed above with reference to the method 500. Thus, at block 614, CD-SEM measurement data for the post-OPC wafer pattern is provided (e.g., this may also be referred to as a CD-SEM measured post-OPC wafer pattern). The method 600 proceeds to block 616 where the CD-SEM measured wafer pattern is reversed. In various cases, reversing the CD-SEM measured wafer pattern includes performing an inverse process (e.g., such as an ILT process) using an OPC model without mask corner rounding terms (provided via block 618), although other OPC model terms may be used, to convert the CD-SEM measured wafer pattern into a mask pattern. In some embodiments, and as a result of reversing the CD-SEM measured wafer pattern (block 616), an inverse mask pattern is provided at block 620.

Thus, after completion of the CD-SEM measurement process group 602 and the OPC process group 604, a CD-SEM measured mask pattern (block 612) and a reversed mask pattern (block 620) are provided. The method 600 then proceeds to block 622 where the inverse mask pattern of block 620 is compared to the CD-SEM measured mask pattern of block 612, and the results of the comparison are provided as validation results at block 624. In some embodiments, the comparison includes comparing mask contours or CDs obtained by each of the CD-SEM measurement process group 602 and the OPC process group 604. By way of example, and in some embodiments, if the inverse mask pattern matches (e.g., is substantially the same) the CD- SEM measured mask pattern, then it is determined that an MPC process will not improve a final wafer pattern, and there is no need to construct an MPC model and proceed with MPC related processing. As such, unnecessary costs and development delays can be avoided. Thus, if it is determined that an MPC process will not improve the final wafer pattern, then a mask will be fabricated (e.g., by mask fabrication 144) based on the post-OPC layout pattern.

In addition, the various embodiments disclosed herein, including aspects of the methods 500 and 600, may be implemented on any suitable computing system, such as the mask design system 180 described in association with FIG. 2. In some embodiments, aspects of the methods 500 and 600 may be executed on a single computer, local area networks, client-server networks, wide area networks, internets, hand-held and other portable and wireless devices and networks. Such a system architecture may take the form of an entirely hardware embodiment, an entirely software embodiment, or an embodiment containing both hardware and software elements. By way of example, hardware may include at least processor-capable platforms, such as client-machines (also known as personal computers or servers), and hand-held processing devices (such as smart phones, personal digital assistants (PDAs), or personal computing devices (PCDs)), for example. In addition, hardware may include any physical device that is capable of storing machine-readable instructions, such as memory or other data storage devices. Other forms of hardware include hardware sub-systems, including transfer devices such as modems, modem cards, ports, and port cards, for example. In various examples, software may include any machine code stored in any memory medium, such as RAM or ROM, and machine code stored on other devices (such as floppy disks, flash memory, or a CD-ROM, for example). In some embodiments, software may include source or object code, for example. In addition, software may encompass any set of instructions capable of being executed in a client machine or server.

Furthermore, embodiments of the present disclosure can take the form of a computer program product accessible from a tangible computer-usable or computer-readable medium providing program code for use by or in connection with a computer or any instruction execution system. For the purposes of this description, a tangible computer-usable or computer-readable medium may be any apparatus that can contain, store, communicate, propagate, or transport the program for use by or in connection with the instruction execution system, apparatus, or device. The medium may be an electronic, magnetic, optical, electromagnetic, infrared, a semiconductor system (or apparatus or device), or a propagation medium.

In some embodiments, defined organizations of data known as data structures may be provided to enable one or more embodiments of the present disclosure. For example, a data structure may provide an organization of data, or an organization of executable code. In some examples, data signals may be carried across one or more transmission media and store and transport various data structures, and may thus be used to transport an embodiment of the present disclosure.

The embodiments of the present disclosure offer advantages over existing art, though it is understood that other embodiments may offer different advantages, not all advantages are necessarily discussed herein, and that no particular advantage is required for all embodiments. By the disclosed methods, shortcomings of existing MPC processes are effectively overcome. For example, embodiments of the present disclosure provide for using an inverse method (e.g., such as inverse lithography technology, ILT) to reverse a wafer pattern into a mask pattern (e.g., creating an inverse mask pattern). In some embodiments, the inverse method uses an OPC model without mask corner rounding terms. In some examples, by comparing the inverse mask pattern to a calculated mask pattern using an MPC model, it can be predetermined whether or not the MPC process would improve final wafer printing. By providing an early indication as to whether an MPC process, used after an OPC process, will actually improve wafer printing, time and cost of additional mask making and wafer printing can be avoided. Those of skill in the art will readily appreciate that the methods described herein may be applied to a variety of other semiconductor layouts, semiconductor devices, and semiconductor processes to advantageously achieve similar benefits to those described herein without departing from the scope of the present disclosure.

Thus, one of the embodiments of the present disclosure described a method for fabricating a semiconductor device including performing an OPC process to an IC layout pattern to generate a post-OPC layout pattern. In some embodiments, the method further includes applying an MPC model to the post-OPC layout pattern to generate a simulated mask pattern. By way of example, the simulated mask pattern is compared to a mask pattern calculated from a target wafer pattern. Thereafter, and based on the comparing, an outcome of an MPC process is determined.

In another of the embodiments, discussed is a method for fabricating a semiconductor device including providing a post-OPC layout pattern and simulating a first mask pattern based on the post-OPC layout pattern and using a post-OPC correction process. In some embodiments, the method further includes simulating a second mask pattern based on data from a physically measured patterned wafer and using an OPC model without mask corner rounding terms. In various cases, the simulated first mask pattern is compared to the simulated second mask pattern. In some embodiments, and based on the comparing, it is determined that the post-OPC correction process will improve a final wafer pattern.

In yet other embodiments, discussed is a method including fabricating a mask using a post-OPC layout pattern and performing a CD-SEM measurement of the mask to provide a CD-SEM measured mask pattern. In some embodiments, the method further includes providing a CD-SEM measured wafer pattern. By way of example, the method further includes using an OPC model without mask corner rounding terms to perform an inverse process to the CD-SEM measured wafer pattern, where the inverse process provides a mask pattern calculated from the CD-SEM measured wafer pattern. In some embodiments, the method further includes comparing the CD-SEM measured mask pattern to the mask pattern calculated from the CD-SEM measured wafer pattern. Based on the comparing, and in some examples, an outcome of an MPC process is determined.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of semiconductor device fabrication, comprising:
   performing an optical proximity correction (OPC) process to an integrated circuit (IC) layout pattern to generate a post-OPC layout pattern;
   applying a mask process correction (MPC) model to the post-OPC layout pattern to generate a simulated mask pattern without fabricating a mask based on the post-OPC layout pattern;
   comparing the simulated mask pattern to a mask pattern calculated from a target wafer pattern; and
   based on the comparing, determining an outcome of an MPC process.

2. The method of claim 1, further comprising:
   providing a critical dimension (CD)-scanning electron microscope (SEM) measured post-OPC wafer pattern; and
   using an OPC model without mask corner rounding terms to perform an inverse process to the CD-SEM measured post-OPC wafer pattern, wherein the inverse process generates the mask pattern calculated from the target wafer pattern.

3. The method of claim 2, wherein the inverse process includes an inverse lithography technology (ILT) process.

4. The method of claim 2, further comprising:
   prior to providing the CD-SEM measured post-OPC wafer pattern, fabricating the mask using the post-OPC layout pattern;
   using the mask to pattern a wafer; and
   performing a CD-SEM measurement of the wafer to provide the CD-SEM measured post-OPC wafer pattern.

5. The method of claim 1, further comprising:
   using an OPC model with mask corner rounding terms to perform the OPC process.

6. The method of claim 1, wherein the comparing the simulated mask pattern to the mask pattern calculated from the target wafer pattern includes comparing mask contours or CDs of each of the simulated mask pattern and the mask pattern calculated from the target wafer pattern.

7. The method of claim 6, wherein the determining the outcome of the MPC process includes determining that the MPC process will improve a final wafer pattern when the mask contours or CDs of each of the simulated mask pattern and the mask pattern calculated from the target wafer pattern are matched.

8. The method of claim 7, further comprising:
   after determining that the MPC process will improve the final wafer pattern, performing the MPC process to the post-OPC layout pattern to generate a post-MPC layout pattern; and
   fabricating another mask based on the post-MPC layout pattern.

9. The method of claim 8, further comprising:
   using the mask based on the post-MPC layout pattern to pattern a wafer.

10. A method of semiconductor device fabrication, comprising:
    providing a post-optical proximity correction (OPC) layout pattern;
    prior to fabricating a mask based on the post-OPC layout pattern and prior to printing a wafer based on the fabricated mask, simulating a first mask pattern based on the post-OPC layout pattern and using a post-OPC correction process;
    simulating a second mask pattern based on data from a physically measured patterned wafer and using an OPC model without mask corner rounding terms;
    comparing the simulated first mask pattern to the simulated second mask pattern; and
    based on the comparing, determining that the post-OPC correction process will improve a final wafer pattern.

11. The method of claim 10, wherein the post-OPC correction process includes a mask process correction (MPC) process.

12. The method of claim 10, wherein the simulating the second mask pattern includes performing an inverse lithography technology (ILT) process based on the data from the physically measured patterned wafer and using the OPC model without mask corner rounding terms.

13. The method of claim 10, further comprising:
    performing an OPC process to an IC layout pattern using an OPC model with mask corner rounding terms to provide the post-OPC layout pattern.

14. The method of claim 10, wherein the comparing the simulated first mask pattern to the simulated second mask pattern includes comparing mask contours or CDs of each of the simulated first mask pattern and the simulated second mask pattern.

15. The method of claim 14, wherein the determining that the post-OPC correction process will improve the final wafer pattern includes determining that the mask contours or CDs of each of the simulated first and second mask patterns are matched.

16. The method of claim 10, further comprising:
    after determining that the post-OPC correction process will improve the final wafer pattern, performing the post-OPC correction process to the post-OPC layout pattern to generate a corrected layout pattern;
    fabricating another mask based on the corrected layout pattern; and
    using the mask based on the corrected layout pattern to pattern a wafer.

17. A method of semiconductor device fabrication, comprising:
    fabricating a mask using a post-optical proximity correction (OPC) layout pattern;
    performing a critical dimension (CD)-scanning electron microscope (SEM) measurement of the mask to provide a CD-SEM measured mask pattern;
    physically printing a wafer based on the mask to obtain a patterned wafer and performing a CD-SEM measurement of the patterned wafer to provide a CD-SEM measured wafer pattern;
    using an OPC model without mask corner rounding terms to perform an inverse process to the CD-SEM measured wafer pattern, wherein the inverse process provides a mask pattern calculated from the CD-SEM measured wafer pattern;
    comparing the CD-SEM measured mask pattern to the mask pattern calculated from the CD-SEM measured wafer pattern; and
    based on the comparing, determining an outcome of a mask process correction (MPC) process.

18. The method of claim 17, wherein the inverse process includes an inverse lithography technology (ILT) process.

19. The method of claim 17, wherein the comparing the CD-SEM measured mask pattern to the mask pattern calculated from the CD-SEM measured wafer pattern includes comparing mask contours or CDs of each of the CD-SEM measured mask pattern and the mask pattern calculated from the CD-SEM measured wafer pattern.

20. The method of claim 19, wherein the determining the outcome of the MPC process includes determining that the MPC process will not improve a final wafer pattern when the mask contours or CDs of each of the CD-SEM measured mask pattern and the mask pattern calculated from the CD-SEM measured wafer pattern are not matched.

* * * * *